(12) United States Patent
Kim

(10) Patent No.: US 11,594,290 B2
(45) Date of Patent: Feb. 28, 2023

(54) MEMORY DEVICE AND OPERATING METHOD THEREOF

(71) Applicant: SK hynix Inc., Gyeonggi-do (KR)

(72) Inventor: Jae Woong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/339,503

(22) Filed: Jun. 4, 2021

(65) Prior Publication Data
US 2022/0172793 A1      Jun. 2, 2022

(30) Foreign Application Priority Data

Dec. 1, 2020 (KR) ..................... 10-2020-0166027

(51) Int. Cl.
| | |
|---|---|
| G11C 16/14 | (2006.01) |
| G11C 16/34 | (2006.01) |
| G11C 16/26 | (2006.01) |
| G11C 16/04 | (2006.01) |
| G11C 16/20 | (2006.01) |
| G11C 16/30 | (2006.01) |
| G11C 16/24 | (2006.01) |

(52) U.S. Cl.
CPC ...... G11C 16/3445 (2013.01); G11C 16/0433 (2013.01); G11C 16/14 (2013.01); G11C 16/20 (2013.01); G11C 16/24 (2013.01); G11C 16/26 (2013.01); G11C 16/30 (2013.01)

(58) Field of Classification Search
CPC . G11C 16/3445; G11C 16/0433; G11C 16/14; G11C 16/20; G11C 16/24; G11C 16/26; G11C 16/30
See application file for complete search history.

(56) References Cited

U.S. PATENT DOCUMENTS

| | | | |
|---|---|---|---|
| 2006/0186451 A1* | 8/2006 | Dusberg | H01L 27/1085 257/306 |
| 2015/0325303 A1* | 11/2015 | Hashimoto | G11C 7/14 365/185.11 |
| 2021/0249087 A1* | 8/2021 | Oh | G11C 16/16 |

FOREIGN PATENT DOCUMENTS

| | | | | |
|---|---|---|---|---|
| KR | 10-2019-0139519 A | 12/2019 | | |
| KR | 10-2059921 B1 | 2/2020 | | |
| KR | 1020210100880 | * | 8/2021 | ............. G11C 16/16 |

* cited by examiner

*Primary Examiner* — Jay W. Radke
(74) *Attorney, Agent, or Firm* — IP & T Group LLP

(57) ABSTRACT

A memory device includes a common source line, a memory cell array, bit lines, and a conductive layer. The common source line is formed on a substrate. The memory cell array is formed on the common source line. The bit lines are connected to the memory cell array. The conductive layer is formed over the bit lines. In an erase operation, the memory device increases a voltage of the bit lines to an erase voltage through capacitive coupling by increasing a voltage applied to the conductive layer.

20 Claims, 12 Drawing Sheets

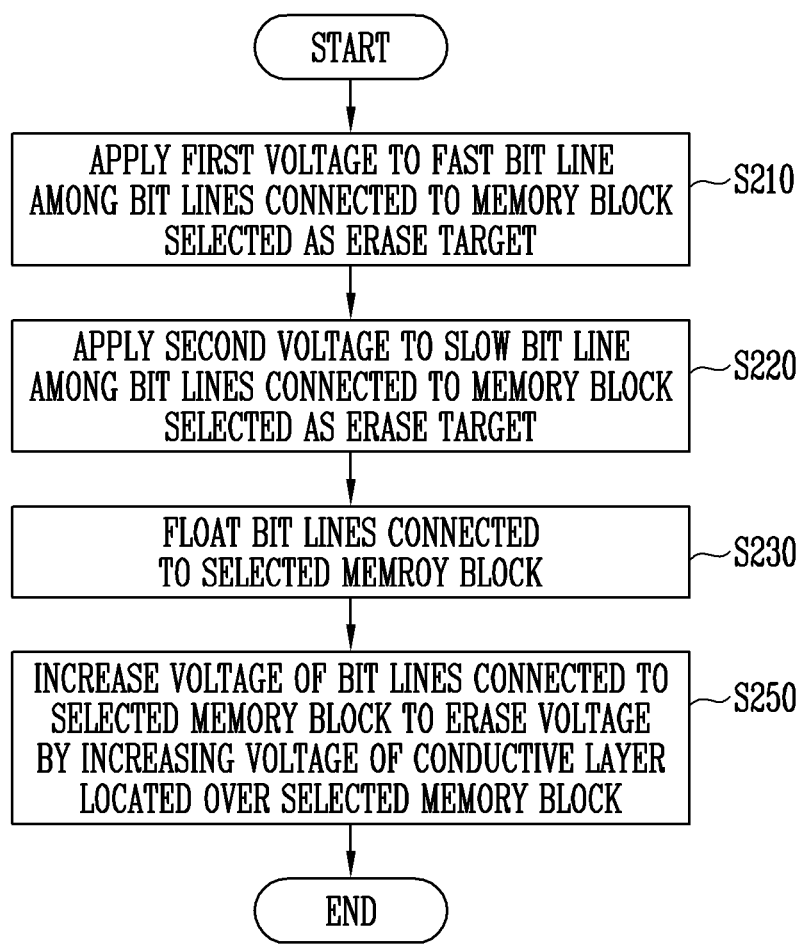

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0166027, filed on Dec. 1, 2020, which is incorporated herein by reference in its entirety.

BACKGROUND

Field of Invention

The present disclosure generally relates to a memory device, and more particularly, to a three-dimensional memory device and an operating method thereof.

Description of Related Art

A memory device includes memory cells capable of storing data. In order to improve the degree of integration of memory cells, a three-dimensional memory device has been proposed.

The three-dimensional memory device may include a plurality of memory cells connected in series by a channel structure extending in a vertical direction. Data stored in the memory cells of the three-dimensional memory device may be erased by a Gate Induced Drain Leakage (GIDL) erase operation of generating holes by using a GIDL current.

SUMMARY

Embodiments of the present disclosure provide a memory device having improved erase performance and an operating method thereof.

In accordance with an aspect of the present disclosure, there is provided a memory device including: a common source line formed on a substrate; a memory cell array formed on the common source line; bit lines connected to the memory cell array; and a conductive layer formed over the bit lines, wherein the memory device is configured to increase a voltage of the bit lines to an erase voltage through capacitive coupling between the conductive layer and the bit lines by increasing a voltage applied to the conductive layer in an erase operation.

The memory cell array may include: a gate stack structure including interlayer insulating layers and conductive patterns, which are alternately stacked; and channel structures connected to the common source line while penetrating the gate stack structure. Each of the channel structures may be connected to a bit line corresponding thereto among the bit lines.

The common source line may include a contact region not overlapping with the gate stack structure.

The memory device may further include a conductive source contact structure extending toward the conductive layer from the contact region of the common source line.

The memory device may further include: a peripheral circuit including a source line driver configured to provide an erase voltage to the common source line or discharge the common source line; and an internal voltage generator configured to provide internal voltages to the peripheral circuit.

The conductive layer may connect the common source line to the source line driver.

The conductive layer may connect the internal voltage generator to the peripheral circuit.

In the erase operation, the memory device may be further configured to apply an initialization voltage to the bit lines, and float the bit lines before the increasing of the voltage of the bit lines. In addition, the memory device may increase the voltage of the bit lines from the initialization voltage to the erase voltage by increasing the voltage of the conductive layer.

The memory device may increase the voltage of the bit lines by applying a first voltage to a first bit line connected to a memory string of which an erase verify operation has passed among the bit lines; applying a second voltage higher than the first voltage to a second bit line connected to a memory string of which the erase verify operation has failed among the bit lines; floating the first bit line and the second bit line; and increasing a voltage of the first bit line from the first voltage to a first erase voltage and increasing a voltage of the second bit line from the second voltage to a second erase voltage higher than the first erase voltage, by increasing the voltage of the conductive layer.

The memory device may increase the voltage of the bit lines by applying a first voltage to a first bit line connected to a memory string of which an erase verify operation has passed among the bit lines; applying a second voltage higher than the first voltage to a second bit line connected to a memory string of which the erase verify operation has failed among the bit lines; floating the second bit line; and increasing a voltage of the second bit line from the second voltage to the erase voltage by increasing the voltage of the conductive layer.

In accordance with another aspect of the present disclosure, there is provided a method for operating a memory device including a plurality of bit lines and a conductive layer formed over the plurality of bit lines, the method including: applying an initialization voltage to the bit lines; floating the bit lines; and increasing a voltage of the bit lines from the initialization voltage to an erase voltage through capacitive coupling between the conductive layer and the bit lines by increasing a voltage of the conductive layer.

The initialization voltage may be a ground voltage.

The initialization voltage may be a voltage higher than 0V.

When the voltage of the bit lines is increased to the erase voltage, a gate induced drain leakage (GIDL) current is generated between a junction region of a select transistor connected to the bit line and a drain select line.

The applying the initialization voltage to the bit lines may include: applying a first voltage to a first bit line connected to a memory string of which an erase verify operation has passed among the bit lines; and applying a second voltage higher than the first voltage to a second bit line connected to a memory string of which the erase verify operation has failed among the bit lines.

The floating of the bit lines may include floating the first bit line and the second bit line.

The increasing the voltage of the bit lines from the initialization voltage to the erase voltage through the capacitive coupling may include increasing a voltage of the first bit line from the first voltage to a first erase voltage and increasing a voltage of the second bit line from the second voltage to a second erase voltage higher than the first erase voltage, by increasing the voltage of the conductive layer.

The floating of the bit lines may include floating the second bit line.

The increasing the voltage of the bit lines from the initialization voltage to the erase voltage through the capacitive coupling may include increasing a voltage of the second bit line from the second voltage to the erase voltage by increasing the voltage of the conductive layer.

In accordance with still another aspect of the present disclosure, there is provided a memory device including: a common source line formed on a substrate; a memory cell array formed on the common source line and including first and second memory cell strings; first and second bit lines electrically coupled respectively to the first and second memory cell strings; a conductive layer disposed over the bit lines; and a logic circuit electrically coupled to the conductive layer and the bit lines. The logic circuit is configured to: apply first and second initialization voltages respectively to the first and second bit lines, float the second bit line, and raise a voltage of the conductive layer to raise, through capacitive coupling between the conductive layer and the second bit line, a voltage of the second bit line to a second erase voltage.

The first memory string may be a memory string, on which a previous erase verify operation passes. The second memory string may be a memory string, on which the previous erase verify operation fails.

The first initialization voltage may be lower than the second initialization voltage.

The logic circuit may be further configured to raise a voltage of the first bit line to a first erase voltage. The first erase voltage may be lower than the second erase voltage.

The logic circuit may be further configured to float the first bit line. The logic circuit may raise the voltage of the first bit line to the first erase voltage through capacitive coupling between the conductive layer and the first bit line.

The memory cell array may include gate stack structures and channel structures. The gate stack structures may be spaced apart from each other. Each gate stack structure may include interlayer insulating layers and conductive patterns, which are alternately stacked. The channel structures may be electrically coupled to the common source line while penetrating the gate stack structures. Each of the channel structures may be electrically coupled to a corresponding one of the bit lines.

The common source line may include a contact region between the gate stack structures.

The memory device may further include a conductive source contact structure extending toward the conductive layer from the contact region.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 10 is a flowchart illustrating an operating method of a memory device in accordance with another embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
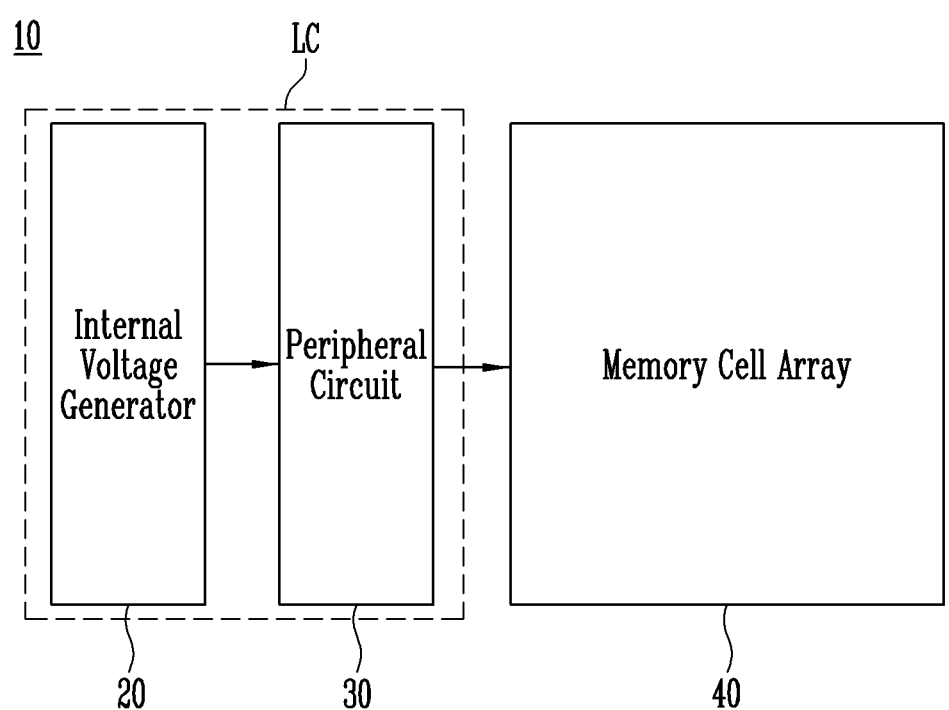
FIGS. 1 and 2 are block diagrams illustrating a memory device in accordance with an embodiment of the present disclosure.

FIG. 1 is a block diagram schematically illustrating a memory device 10 in accordance with an embodiment of the present disclosure.

Referring to FIG. 1, the memory device 10 may include a logic circuit LC and memory cell array 40. The logic circuit LC may include an internal voltage generator 20 and a peripheral circuit 30.

The internal voltage generator 20 may be configured to generate various internal voltages by receiving an external voltage. In an embodiment, the internal voltages may include an internal ground voltage and an internal power voltage.

The peripheral circuit 30 may be configured to perform a program operation for storing data in the memory cell array 40, a read operation for outputting data stored in the memory cell array 40, and an erase operation for erasing data stored in the memory cell array 40. Internal voltages required to activate the peripheral circuit 30 may be generated from the internal voltage generator 20 to be supplied to the peripheral circuit 30.

Figure 2:
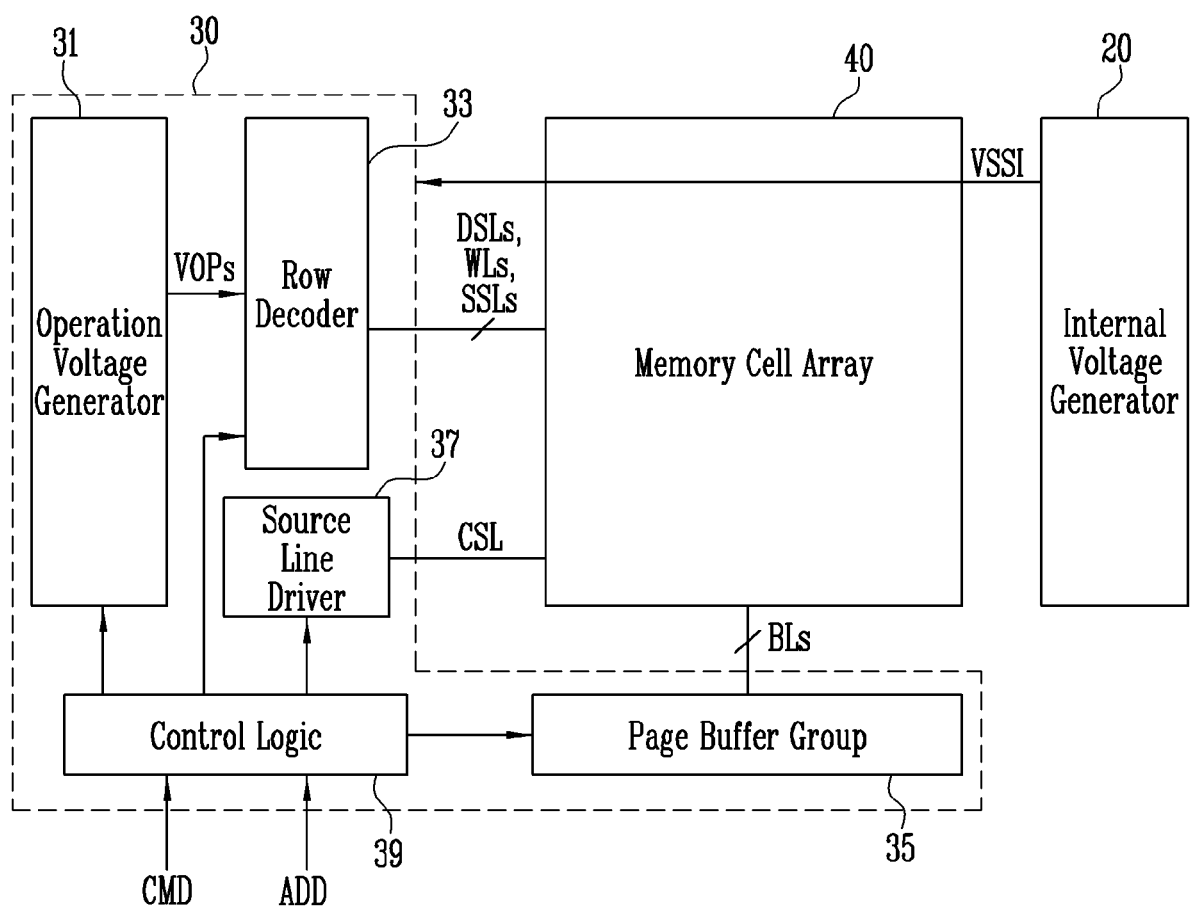

FIG. 2 is a block diagram illustrating the peripheral circuit 30 shown in FIG. 1 in accordance with an embodiment of the present disclosure.

Referring to FIG. 2, the peripheral circuit 30 may include a control logic 39, an operation voltage generator 31, a row decoder 33, a source line driver 37, and a page buffer group 35.

The memory cell array 40 may include a plurality of memory blocks. Each of the memory blocks may be connected to one or more drain select lines DSLs, a plurality of word lines WLs, one or more source select lines SSLs, a plurality of bit lines BLs, and at least one common source line.

The control logic 39 may control the peripheral circuit 30 in response to a command CMD and an address ADD.

The operation voltage generator 31 may generate various operation voltages VOPs used for a program operation, a read operation, and an erase operation under the control of the control logic 39. The operation voltages VOPs may include a program voltage, a verify voltage, a pass voltage, a select line voltage, and the like.

The row decoder 33 may select a memory block under the control of the control logic 39. The row decoder 33 may apply the operation voltages VOPs to the drain select lines DSLs, the word lines WLs, and the source select lines SSLs, which are connected to the selected memory block.

The source line driver 37 may be connected to the memory cell array 40 through the common source line CSL. The source line driver 37 may perform a discharge operation of the common source line under the control of the control logic 39. The source line driver 37 may apply a pre-erase voltage and an erase voltage to the common source line CSL in an erase operation under the control of the control logic 39.

The page buffer group 35 may be connected to the memory cell array 40 through the bit lines BL. The page buffer group 35 may temporarily store data to be programmed, which is received from an input/output circuit (not shown), in a program operation under the control of the control logic 39. The page buffer group 35 may sense a voltage or current of the bit lines BLs in a read operation or a verify operation under the control of the control logic 39. The page buffer group 35 may selectively float the bit lines BLs under the control of the control logic 39.

Internal voltages output from the internal voltage generator 20 may be supplied to the peripheral circuit 30. In an embodiment, an internal ground voltage VSSI may be output from the internal voltage generator 20. The internal ground voltage VSSI may be supplied to the peripheral circuit 30 via a line overlapping with the memory cell array 40.

Figure 3:
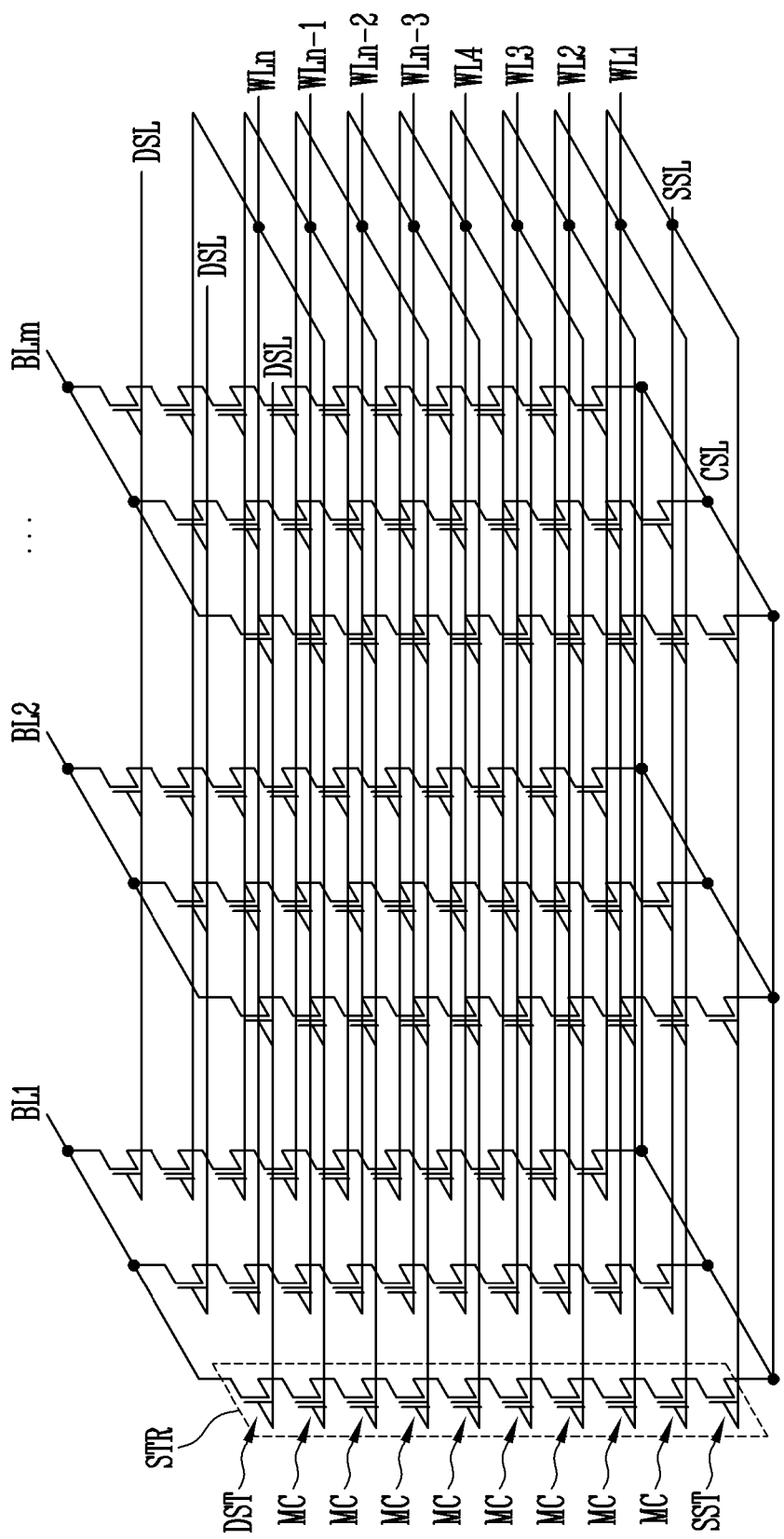
FIG. 3 is an equivalent circuit diagram illustrating a memory block in accordance with an embodiment of the present disclosure.

FIG. 3 is an equivalent circuit diagram illustrating a memory block in accordance with an embodiment of the present disclosure.

Referring to FIG. 3, the memory block may include a plurality of memory cell strings STR commonly connected to a common source line CSL. The memory cell strings STR may be connected to a plurality of bit lines BL1 to BLm. The memory cell strings STR may be divided into a plurality of column groups respectively connected to the bit lines BL1 to BLm. Memory cell strings STR of each column group may be connected in parallel to a bit line corresponding thereto.

Each of the memory cell strings STR may include one or more drain select transistors, a plurality of memory cells, and one or more source select transistors, which are disposed between a bit line corresponding thereto and the common source line CSL. A gate of each of the drain select transistors may be connected to a drain select line corresponding thereto, a gate of each of the plurality of memory cells may be connected to a word line corresponding thereto, and a gate of each of the source select transistors may be connected to a source select line corresponding thereto.

In an embodiment, each of the memory cell strings STR may be connected to a drain select line DSL, a plurality of word lines WL1 to WLn, and a source select line SSL. Each of the memory cell strings STR may include a drain select transistor DST connected to the drain select line DSL, a plurality of memory cells MC connected to the word lines WL1 to WLn, and a source select transistor SST connected to the source select line SSL.

The plurality of memory cells MC may be connected in series. The drain select transistor DST may be disposed between the plurality of memory cells MC and a bit line corresponding thereto. The drain select transistor DST may include a junction region connected to a bit line corresponding thereto. The source select transistor SST may be disposed between the plurality of memory cells MC and the common source line CSL. The source select transistor SST may include a junction region connected to the common source line CSL.

The structure of each of the memory cell strings STR is not limited to the embodiment shown in FIG. 3. In an embodiment, each of the memory cell strings STR may include two or more drain select transistors which are disposed between the plurality of memory cells MC connected in series and a bit line corresponding thereto and are connected in series. Two or more drain select lines may be disposed between the bit lines BL1 to BLm and the word lines WL1 to WLn. In an embodiment, each of the memory cell strings STR may include two or more source select transistors which are disposed between the plurality of memory cells MC connected in series and the common source line CSL, and are connected in series. Two or more source select lines may be disposed between the common source line CSL and the word lines WL1 to WLn.

In an embodiment, at least one of the word lines WL1 to WLn may be used as a dummy word line. For example, at least one of a word line WL1 adjacent to the source select line SSL and a word line WLn adjacent to the drain select line DSL may be used as a dummy word line.

An erase operation of the memory device may include a hot hole forming period and an erase period.

Referring to FIGS. 2 and 3, during the hot hole forming period of the erase operation, the row decoder 33 may control the word lines WL1 to WLn of the selected memory block to be in a floating state and control the bit lines BL1 to BLm of the selected memory block to be in the floating state.

During the hot hole forming period of the erase operation, the operation voltage generator 31 may apply, to the common source line CSL, a pre-erase voltage for generating a Gate Induced Drain Leakage (GIDL) current. When a voltage level of the source select line SSL is low, a GIDL current may be generated between the source select line SSL and the junction region of the source select transistor SST. In an embodiment, during the hot hole forming period of the erase operation, the row decoder 33 may control the source select line SSL to have a ground voltage level.

When the GIDL current is generated, hot holes may be generated. The generated hot holes may be injected into a channel region of the memory cell string STR, and the GIDL current may be generated in the channel region.

Subsequently, during the erase period of the erase operation, the operation voltage generator 31 may apply an erase voltage higher than the pre-erase voltage to the common source line CSL. As a result, a channel voltage of the memory cell string STR is further increased.

During the erase period of the erase operation, the row decoder 33 may control the source select line SSL to be in the floating state, and control the word lines WL1 to WLn to have the ground voltage level. Accordingly, data stored in the memory cells MC may be erased by a voltage difference between the channel region of the memory cell string STR, which has an increase potential level, and the word lines WL1 to WLn having the ground voltage level.

The erase operation may be ended when the source select line SSL is turned off by controlling the source select line SSL to have the ground voltage level through the row decoder 33.

In an embodiment, in order to improve the efficiency of the above-described GIDL erase operation, during the erase operation, a voltage applied to the common source line CSL may be applied to the bit lines BL1 to BLm, and a voltage applied to the source select line SSL may be applied to the drain select line DSL. Accordingly, during the erase operation, the GIDL current is generated between the drain select line DSL and the junction region of the drain select transistor DST, so that the efficiency of the erase operation can be improved.

In an embodiment, a high voltage may be applied to a conductive layer located over the bit lines BL1 to BLm, so that a voltage of the bit lines BL1 to BLm is increased to the erase voltage through capacitive coupling. Although transistors for directly applying a high voltage to the bit lines BL1 to BLm are not separately provided to the page buffer group 35 shown in FIG. 2, the efficiency of the erase operation can be improved. Thus, when a high voltage for erase is applied to the bit lines BL1 to BLm by using the capacitive coupling, there is an advantage due to high integration of the memory device.

Figure 4:
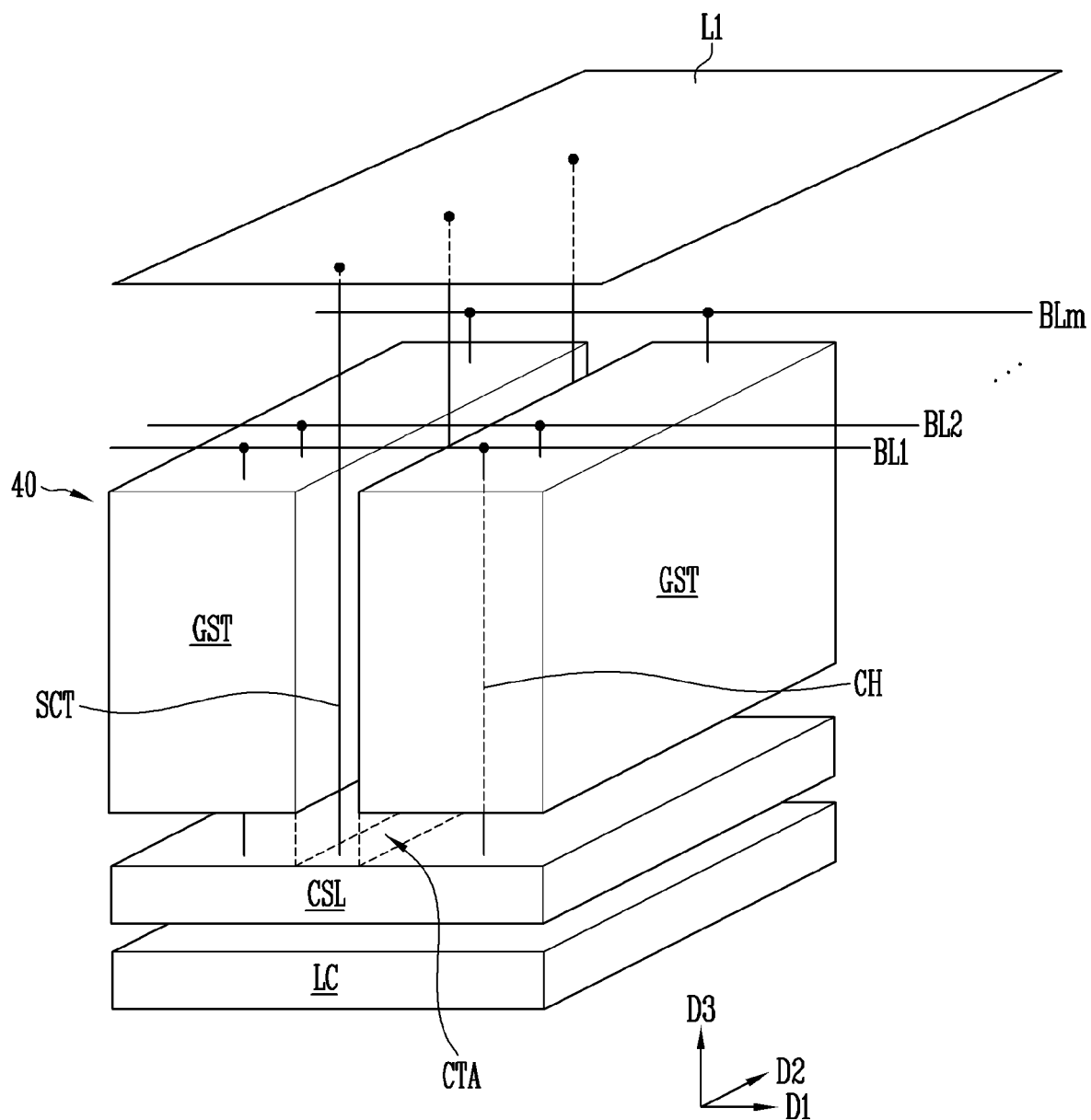
FIG. 4 is a diagram illustrating a conductive layer located over bit lines of a memory cell array in accordance with an embodiment of the present disclosure.

FIG. 4 is a diagram illustrating a conductive layer located over the bit lines of the memory cell array in accordance with an embodiment of the present disclosure.

Referring to FIG. 4, the memory cell array 40 may be disposed between a common source line CSL and bit lines BL1 to BLm. The memory cell array 40 may include gate stack structures GST and channel structures CH respectively penetrating the gate stack structures GST. The bit lines BL1 to BLm may extend in a first direction D1. Although not shown in FIG. 4, a plurality word lines may extend in a second direction D2. Moreover, the channel structures CH may extend in a third direction D3.

The gate stack structures GST may be spaced apart from each other. FIG. 4 illustrates two gate stack structures GST spaced apart from each other with a conductive source contact structure SCT interposed therebetween. The memory cell array 40 may include three or more gate stack structures GST spaced apart from each other, in addition to the structure shown in FIG. 4.

Each of the channel structures CH may include one end connected to the common source line CSL and the other end connected to a bit line corresponding thereto among the bit lines BL1 to BLm. Each of the channel structures CH and the common source line CSL may be directly connected to each other. Alternatively, a lower channel structure or a contact structure for connecting each of the channel structures CH and the common source line CSL may be formed between each of the channel structures CH and the common source line CSL. Each of the channel structures CH and the bit line corresponding thereto may be directly connected to each other. Alternatively, a contact structure for connecting each of the channel structures CH and the bit line corresponding thereto may be formed between each of the channel structures CH and the bit line corresponding thereto.

The channel structures CH may be arranged in zigzag or a matrix form in a gate stack structure corresponding thereto.

The common source line CSL may be formed on a substrate including the logic circuit LC. The common source line CSL may include a contact region CTA not overlapping with the gate stack structures GST. In an embodiment, the contact region CTA of the common source line CSL may be disposed between the gate stack structures GST adjacent to each other. The source contact structure SCT may extend toward an upper conductive layer L1 from the contact region CTA of the common source line CSL.

In an embodiment, as shown in FIG. 4, the upper conductive layer L1 may be used to connect the common source line CSL to the source line driver 37 shown in FIG. 2. Accordingly, a potential level of the common source line CSL may be discharged through the source line driver 37 shown in FIG. 2 via the upper conductive layer L1. In addition, an erase voltage provided through the source line driver 37 shown in FIG. 2 during an erase operation may be transmitted to the common source line CSL via the upper conductive layer L1. However, the embodiment of the present disclosure is not limited thereto. The upper conductive layer L1 in accordance with the embodiment of the present disclosure may not be connected to the common source line CSL. The upper conductive layer L1 may be used as another object, in addition to an object for connecting the common source line CSL to the source line driver 37 shown in FIG. 2. For example, the upper conductive layer L1 may be used as lines for connecting the internal voltage generator 20 and the peripheral circuit 30, which are shown in FIG. 2, to each other.

FIG. 4 illustrates that one upper conductive layer L1 is formed between the bit lines BL1 to BLm. However, the present disclosure is not limited thereto, and a plurality of upper conductive layers may be formed, which are disposed in the first direction D1 or the second direction D2. In addition, a plurality of upper conductive layers may be formed, which are disposed in the third direction D3.

The upper conductive layer L1 may include a low-resistance metal. The upper conductive layer L1 may include a metal such as copper or aluminum.

Figure 5:
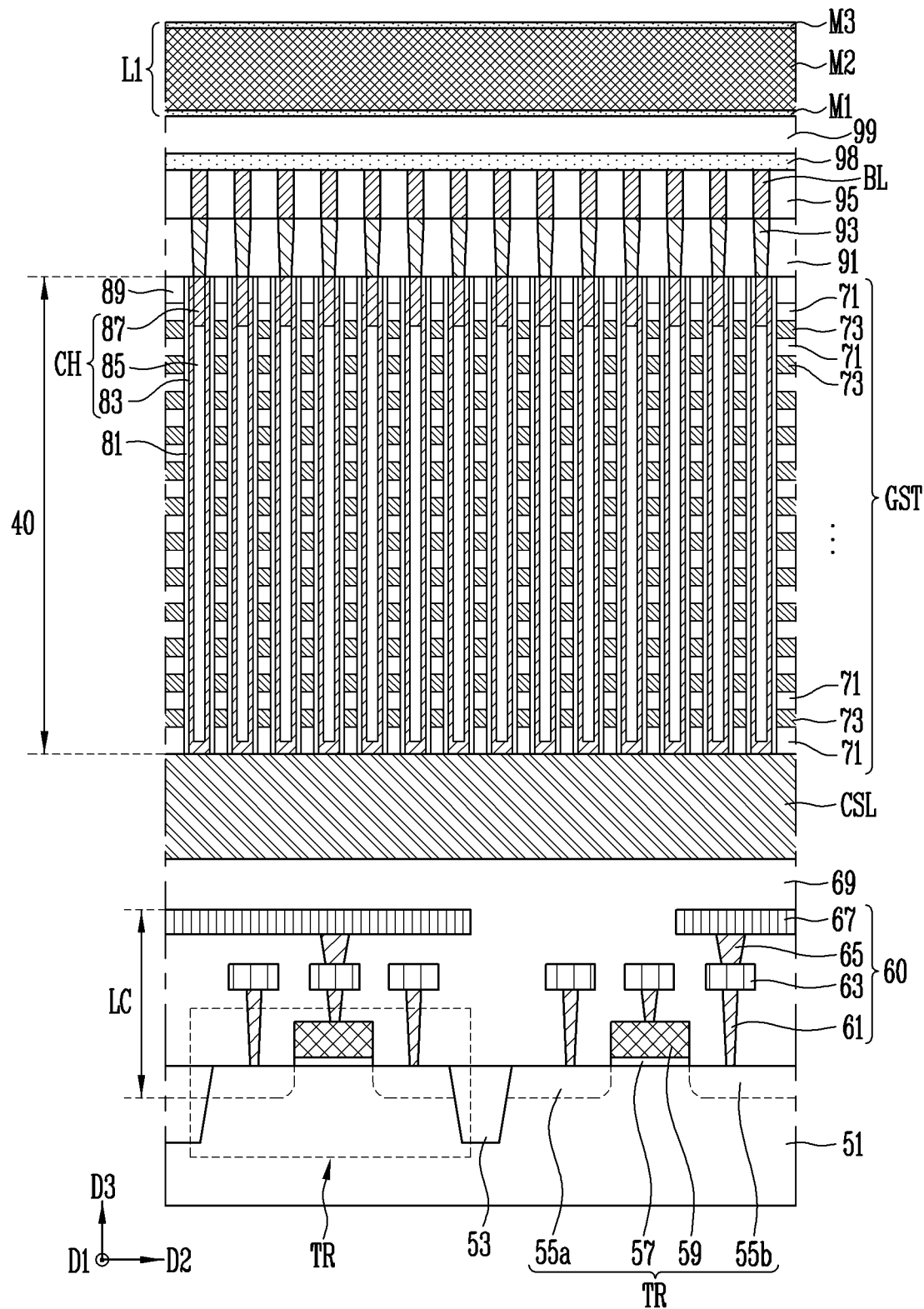
FIGS. 5 and 6 are sectional views illustrating a memory device in accordance with an embodiment of the present disclosure.
Figure 6:
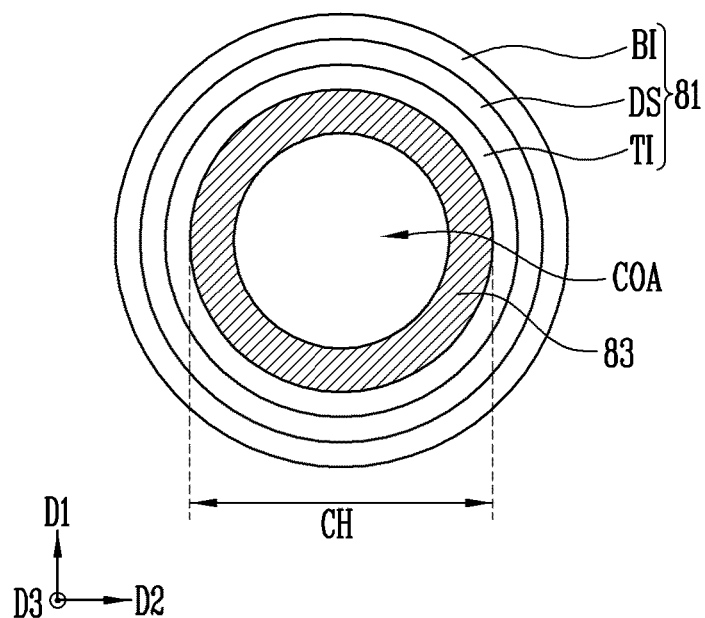

FIGS. 5 and 6 are sectional views illustrating a memory device in accordance with an embodiment of the present disclosure.

Referring to FIG. 5, a common source line CSL may be formed on a substrate 51. The substrate 51 may include the logic circuit LC described above with reference to FIG. 1.

The substrate 51 may be, for example, a bulk silicon substrate, a silicon on insulator substrate, a germanium substrate, a germanium on insulator substrate, a silicon-germanium substrate, or an epitaxial thin film formed through a selective epitaxial growth process.

The common source line CSL may overlap with transistors TR of the logic circuit LC. Each of the transistors TR may be formed in an active region of the substrate 51, which is defined by an isolation layer 53. Each of the transistors TR may include a gate insulating layer 57 and a gate electrode 59, which are stacked on an active region corresponding thereto, and include junction regions 55a and 55b formed in active regions at both sides of the gate electrode 59. One of the junction regions 55a and 55b may be used as a source region, and the other of the junction regions 55a and 55b may be used as a drain region.

The logic circuit LC may include interconnection structures 60 connected to the transistors TR constituting the logic circuit LC. Each of the interconnection structures 60 may include a plurality of conductive patterns 61, 63, 65, and 67. A configuration of the interconnection structures 60 is not limited to that shown in the drawings, and may be variously modified. The plurality of conductive patterns 61, 63, 65, and 67 included in each of the interconnection structures 60 may include at least one a conductive line, a conductive pad, and a contact plug.

The substrate 51 including the logic circuit LC may be covered by an insulating structure 69. The insulating structure 69 may include two or more insulating layers. The common source line CSL may be disposed on the insulating structure 69.

A memory cell array 40 may be disposed on the common source line CSL. A gate stack structure GST of the memory cell array 40 may include interlayer insulating layers 71 and conductive patterns 73, which are alternately stacked on the common source line CSL. The conductive patterns 73 may be used as the source select line SSL, the word lines WL1 to WLn, and the drain select line DSL, which are described above with reference to FIG. 3. In an embodiment, at least one lower conductive pattern disposed adjacent to the common source line CSL among the conductive patterns 73 may be used as the source select line SSL described above with reference to FIG. 3. In an embodiment, at least one upper conductive pattern disposed adjacent to bit lines BLs among the conductive patterns 73 may be used as the drain select line DSL described above with reference to FIG. 3. Intermediate conductive patterns between the lower conductive pattern and the upper conductive pattern among the conductive patterns 73 may be used as the word lines WL1 to WLn described above with reference to FIG. 3.

Channel structures CH of the memory cell array 40 may penetrate a gate stack structure GST corresponding thereto. The memory cell array 40 may be connected to the common source line CSL by the channel structures CH. A memory layer 81 may be disposed between each of the channel structures CH and the gate stack structure GST. The memory layer 81 may extend along a sidewall of each of the channel structures CH.

Referring to FIGS. 4 and 5, an embodiment having a structure in which the logic circuit LC is located under the gate stack structures GST and the common source line CSL is illustrated. This structure is a Peri-Under Cell (PUC) structure in which the logic circuit LC is located under memory cells. However, the present disclosure is not limited thereto, and a structure in which the logic circuit is located over the gate stack structure GST, i.e., a Peri-Over Cell (POC) structure in which the logic circuit is located over the memory cells is possible. In another embodiment, the logic circuit LC may be formed at another position instead of over or under the gate stack structure GST. That is, the logic circuit LC may be formed at a position at which the logic circuit LC is spaced apart from the gate stack structure GST in the direction D1 or D2. Further, the logic circuit LC may be formed on a separate substrate different from the substrate on which the gate stack structure GST and the common source line CSL.

FIG. 6 is an enlarged cross-sectional view illustrating one of the channel structures CH and the memory layer 81 surrounding the same in accordance with an embodiment of the present disclosure.

Referring to FIG. 6, the memory layer 81 may surround a sidewall of a channel structure CH corresponding thereto. The memory layer 81 may include a tunnel insulating layer TI, a data storage layer DS, and a blocking insulating layer BI, which are stacked on the sidewall of the channel structure CH corresponding thereto. The tunnel insulating layer TI may include silicon oxide through which charges can tunnel. The data storage layer DS may be formed as a charge trap layer. For example, the charge trap layer may include silicon nitride. The blocking insulating layer BI may include oxide capable of blocking charges. The data storage layer DS may be formed of various materials in addition to the charge trap layer, and be modified in various forms between the tunnel insulating layer TI and the blocking insulating layer BI according to the structure of a cell to be implemented. For example, the data storage layer DS may be formed as a material layer including a conductive nano dot, be formed as a phase change material layer, or be formed as a material layer for a floating gate.

Referring to FIGS. 5 and 6 together, the channel structure CH may include a channel layer 83. In an embodiment, the channel layer 83 may be formed as a hollow type. The channel structure CH may further include a core insulating layer 85 and a doped semiconductor layer 87, which fill a central region COA of the channel structure CH, which is defined by the channel layer 83. The doped semiconductor layer 87 may be disposed between the core insulating layer 85 and a bit line BL corresponding thereto among the bit lines BLs.

The channel structure CH is not limited to the example shown in the drawings. For example, the channel structure CH may include a buried channel layer buried in the central region COA of the channel structure CH, and the core insulating layer 85 may be omitted.

The channel layer 83 may be used as a channel region of a memory cell string corresponding thereto. The channel layer 83 may be formed of a semiconductor material. In an embodiment, the channel layer 83 may include a silicon layer.

Referring to FIG. 5, one end of the channel structure CH, which faces the common source line CSL, may be connected to the common source line CSL. In an embodiment, a portion of the channel layer 83, which constitutes the one end of the channel structure CH, may be directly connected to the common source line CSL.

The other end of the channel structure CH, which faces a bit line BL corresponding thereto, may be connected to the bit line BL corresponding thereto via a contact plug 93 formed of a conductive material. In an embodiment, the doped semiconductor layer 87 constituting the other end of the channel structure CH may be directly connected to the contact plug 93.

A conductivity type dopant may be distributed in a portion of the channel layer 83, which constitutes the other end of the channel structure CH, and the doped semiconductor layer 87. The conductivity type dopant may include an n-type dopant for junction. The conductivity type dopant may include a counter-doped p-type dopant.

According to the above-described structure, the memory cells MC described above with reference to FIG. 3 may be defined at intersection portions of the intermediate conductive patterns used as the word lines among the conductive patterns 73 and the channel structure CH. The source select transistor SST described above with reference to FIG. 3 may be defined at an intersection portion of the lower conductive pattern used as the source select line among the conductive patterns 73 and the channel structure CH. The drain select transistor DST described above with reference to FIG. 3 may be defined at an intersection portion of the upper conductive pattern used as the drain select line among the conductive patterns 73 and the channel structure CH. The source select transistor SST, the memory cells MC, and the drain select transistor DST, which are described with reference to FIG. 3, may be connected in series by the channel structure CH described above with reference to FIG. 5, to constitute the memory cell string STR described above with reference to FIG. 3.

The gate stack structure GST of the memory cell array 40 may be covered by a first upper insulating layer 89. The channel structures CH may extend to penetrate the first upper insulating layer 89.

The bit lines BLs may be connected to the memory cell array 40 through the channel structures CH. Each of the bit lines BLs may be connected to a channel structure CH corresponding thereto via a contact plug 93 corresponding thereto. The contact plug 93 may be disposed in a second upper insulating layer 91 disposed on the first upper insulating layer 89. The bit lines BLs may be disposed in a third upper insulating layer 95 disposed on the second upper insulating layer 91. The bit lines BLs and the contact plug 93 may be formed of various conductive materials.

The bit lines BLs shown in FIG. 5 may be included in the bit lines BL1 to BLm shown in FIG. 4. The third upper insulating layer 95 penetrated by the bit lines BLs may be covered by a fourth upper insulating layer 99. An etch stop layer 98 may be further formed between the fourth upper insulating layer 99 and the third upper insulating layer 95 penetrated by the bit lines BLs. Each of the first to fourth upper insulating layers 89, 91, 95, and 99 may include oxide, and the etch stop layer 98 may include nitride.

The fourth upper insulating layer 99 may extend to overlap with the bit lines BLs. An upper conductive layer L1 may be disposed on the fourth upper insulating layer 99. The upper conductive layer L1 may overlap with the bit lines BLs, and be spaced apart from the bit lines BLs by the fourth upper insulating layer 99.

The upper conductive layer L1 may be formed of various conductive materials. In an embodiment, the upper conductive layer L1 may include a metal layer M2 having low resistance. Copper or aluminum may be used as the metal layer M2 having low resistance. The upper conductive layer L1 may further include at least one of a conductive barrier layer M1 disposed between the metal layer M2 and the fourth upper insulating layer 99 and a conductive anti-reflective coating (ARC) layer M3 remaining on the fourth upper insulating layer 99. The barrier layer M1 and the ARC layer M3 may be formed of various conductive materials such as titanium nitride (TiN).

The upper conductive layer L1 may be used as a line for connecting the source line driver 37 shown in FIG. 2 and the common source line CSL to each other. This is merely illustrative, and the function of the upper conductive layer L1 in accordance with the present disclosure is not limited thereto. For example, the upper conductive layer L1 may be used as lines for connecting the internal voltage generator 20 and the peripheral circuit 30, which are shown in FIG. 2.

During an erase operation, a high voltage is transferred to the upper conductive layer L1, so that a voltage of bit lines BLs located under the upper conductive layer L1 can be increased.

Figure 7:
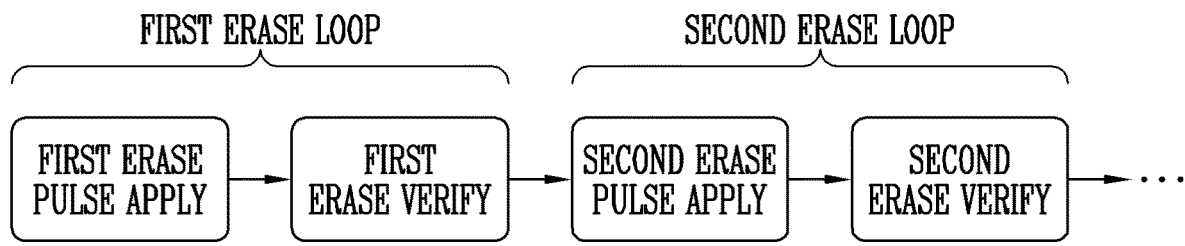
FIG. 7 is a diagram illustrating an erase operation of a memory device in accordance with an embodiment of the present disclosure.

FIG. 7 is a diagram illustrating an erase operation of a memory device in accordance with an embodiment of the present disclosure.

Referring to FIG. 7, the erase operation of the memory device may include a plurality of erase loops. Each erase loop may include an erase pulse apply operation and an erase verify operation. That is, a first erase loop includes a first erase pulse apply operation and a first erase verify operation, and a second erase loop includes a second erase pulse apply operation and a second erase verify operation. The erase loop is repeatedly performed until erase verify passes. When the erase verify does not pass even though a repetition number of the erase loop has reached a threshold value, it may be determined that the erase operation has failed.

In the operation of applying the erase pulse, an erase voltage is applied in a pulse form to memory strings included in a memory block selected as an erase target. As described above, in the operation of applying the erase pulse, the erase voltage may be applied to the common source line CSL, the source select line SSL may be controlled to be in the floating state, and the word lines WL1 to WLn may be controlled to be in the ground voltage level. Data stored in the memory cells may be erased by a voltage difference between the channel region of a memory cell string STR having an increased potential level and the word lines WL1 to WLn having the ground voltage level. To improve the efficiency of the above-described GIDL erase operation, during the erase operation, a voltage applied to the common source line CSL may be applied to the bit lines BL1 to BLm, and a voltage applied to the source select line SSL may be applied to the drain select line DSL. Accordingly, during the erase operation, a GIDL current is generated between the drain select line DSL and the junction region of the drain select transistor DST, so that the efficiency of the erase operation can be improved.

In some embodiments, the erase voltage is not applied to the common source line CSL but may be applied to the bit lines BL1 to BLm. The GIDL current is generated between the drain select line DSL and the junction region of the drain select transistor DST, so that memory cells are erased.

In the erase verify operation, it is verified whether memory cells included in selected memory blocks have been erased. To this end, an erase verify voltage may be applied to word lines WL1 to WLn connected to a memory block selected as an erase target. When threshold voltages of memory cells included in a memory string are all lower than the erase verify voltage, a current may flow through a bit line connected to the corresponding memory string. When threshold voltages of some memory cells among memory cells included in a memory string are higher than the erase verify voltage, the current does not flow through a bit line connected to the corresponding memory string. In this manner, it may be verified whether memory cells have been completely erased for each string.

Figure 8:
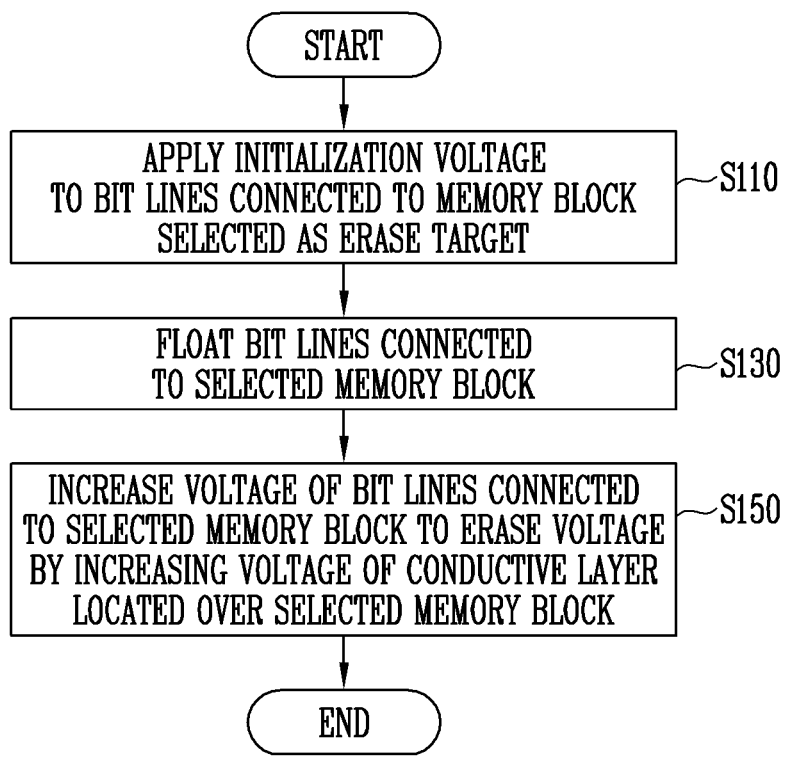
FIG. 8 is a flowchart illustrating an operating method of a memory device in accordance with an embodiment of the present disclosure.

FIG. 8 is a flowchart illustrating an operating method of a memory device in accordance with an embodiment of the present disclosure. More specifically, FIG. 8 is a flowchart illustrating an embodiment of the operation of applying the erase pulse among the plurality of erase loops shown in FIG. 7.

Referring to FIG. 8, the operating method of the memory device in accordance with the embodiment of the present disclosure includes operation S110 of applying an initialization voltage to bit lines connected to a memory block selected as an erase target, operation S130 of floating the bit lines connected to the selected memory block, and operation S150 of increasing a voltage of the bit lines connected to the selected memory block to an erase voltage by increasing a voltage of a conductive layer located over the selected memory block.

In operation S110, an initialization voltage is applied to a plurality of bit lines. Accordingly, voltages of the plurality of bit lines may be initialized equally to one another. In an embodiment, the initialization voltage may be a ground voltage. In another embodiment, the initialization voltage may be a voltage higher than the ground voltage.

In operation S130, the bit lines initialized to the initialization voltage are floated. Subsequently, in operation S150, a voltage of the upper conductive layer L1 shown in FIGS. 4 and 5 is increased. Accordingly, the voltage of the bit lines is increased to the erase voltage by capacitive coupling between the upper conductive layer L1 and the bit lines.

Figure 9A:
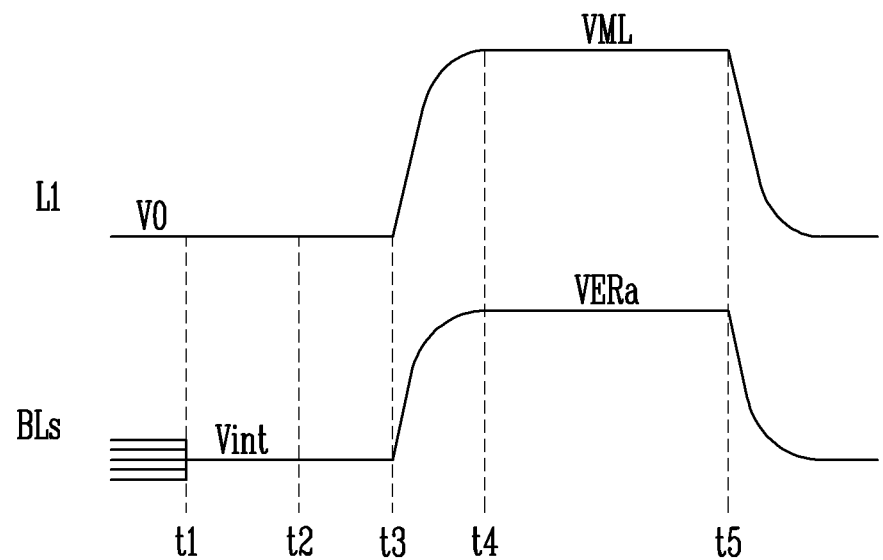
FIGS. 9A and 9B are timing diagrams illustrating the operating method of the memory device in accordance with an embodiment of the present disclosure.
Figure 9B:
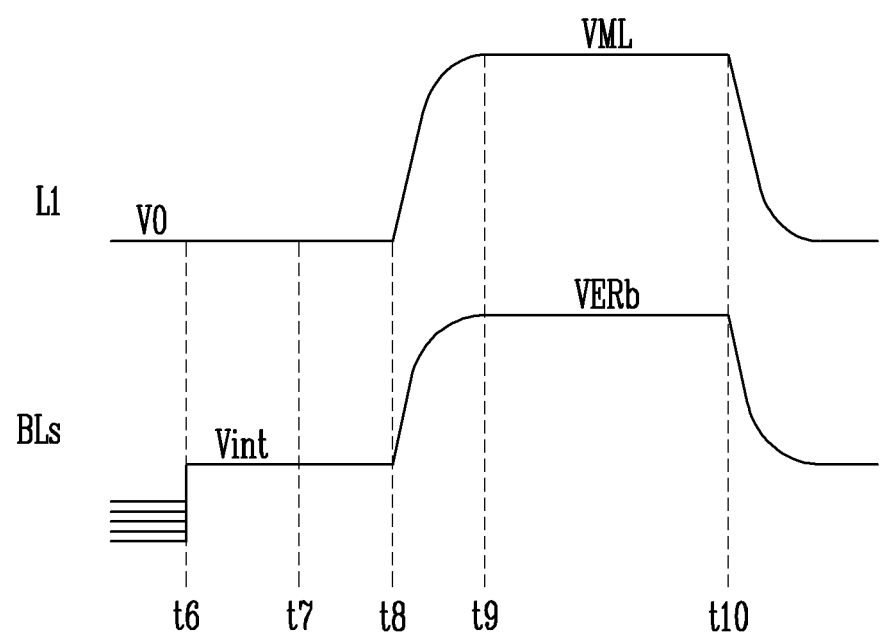

FIGS. 9A and 9B are timing diagrams illustrating the operating method of the memory device in accordance with an embodiment of the present disclosure.

Referring to FIG. 9A, voltage of the upper conductive layer L1 and the voltage of the bit lines BLs according to time are illustrated. In FIG. 9A, illustration of voltages of the word lines, the common source line, the source select line, and the drain select line are omitted.

Before a time t1, the voltage of the upper conductive layer L1 may be a voltage V0. In an embodiment, the voltage V0 may be a ground voltage. Before the time t1, the voltages of the bit lines BLs may have different values.

According to operation S110 shown in FIG. 8, an initialization voltage Vint may be applied to the bit lines BLs at the time t1. In an embodiment, the initialization voltage Vint may be the ground voltage. Subsequently, at a time t2, the bit lines BLs may be floated (S130). Although the bit lines BLs are floated, the initialization voltage Vint of the bit lines BLs is maintained.

Subsequently, at a time t3, the voltage of the upper conductive layer L1 is increased (S150). The voltage of the upper conductive layer L1 may reach a high voltage VML at a time t4. Accordingly, the voltage of the bit lines BLs is increased from the initialization voltage Vint to an erase voltage VERa by capacitive coupling between the upper conductive layer L1 and the bit lines. Accordingly, during a period between the time t4 and a time t5, a GIDL current occurs between the drain select line DSL and the junction region of the drain select transistor DST, and therefore, an erase operation of memory cells is performed. Subsequently, at the time t5, the voltage of the upper conductive layer L1 is decreased. Accordingly, the voltage of the bit lines BLs is also decreased.

Referring to FIG. 9B, voltages of the upper conductive layer L1 and voltages of the bit lines BLs according to time are illustrated.

Before a time t6, the voltage of the upper conductive layer L1 may be a voltage V0. In an embodiment, the voltage V0 may be a ground voltage. Before the time t6, the voltage of the bit lines BLs may have different values.

According to operation S110 shown in FIG. 8, an initialization voltage Vint may be applied to the bit lines BLs at the time t6. The initialization voltage Vint shown in FIG. 9B may be a voltage higher than the ground voltage. The initialization voltage Vint shown in FIG. 9B may be a voltage higher than the voltage of the bit lines BLs before the time t6.

Subsequently, at a time t7, the bit lines BLs may be floated (S130). Although the bit lines BLs are floated, the initialization voltage Vint of the bit lines BLs is maintained.

Subsequently, at a time t8, the voltage of the upper conductive layer L1 is increased (S150). The voltage of the upper conductive layer L1 may reach a high voltage VML at a time t9. Accordingly, the voltage of the bit lines BLs is increased from the initialization voltage Vint to an erase voltage VERb by capacitive coupling between the upper conductive layer L1 and the bit lines. Accordingly, during a period between the time t8 and a time t10, a GIDL current occurs between the drain select line DSL and the junction region of the drain select transistor DST, and therefore, an erase operation of memory cells is performed. Subsequently, at the time t10, the voltage of the upper conductive layer L1 is decreased. Accordingly, the voltage of the bit lines BLs is also decreased.

In the embodiment shown in FIG. 9A, the initialization voltage Vint may have a relatively low voltage value. For example, the initialization voltage Vint shown in FIG. 9A may be the ground voltage. The initialization voltage Vint functions to equally initialize different voltages of the bit lines BLs.

On the other hand, in the embodiment shown in FIG. 9B, the initialization voltage Vint may have a relative high value. Accordingly, the erase voltage VERb shown in FIG. 9B may have a value relatively greater than that of the erase voltage VERa shown in FIG. 9A. The initialization voltage Vint may serve as a precharge voltage for further increasing the erase voltage VERb while equally initializing different voltages of the bit lines BLs.

FIG. 10 is a flowchart illustrating an operating method of a memory device in accordance with another embodiment of the present disclosure. More specifically, FIG. 10 is a flowchart illustrating another embodiment of the operation of applying the erase pulse among the plurality of erase loops shown in FIG. 7.

Referring to FIG. 10, the operating method of the memory device in accordance with the embodiment of the present disclosure includes operation S210 of applying a first voltage to a fast bit line among bit lines connected to a memory block selected as an erase target, operation S220 of applying a second voltage to a slow bit line among the bit lines connected to the memory block selected as the erase target, operation S230 of floating the bit lines connected to the selected memory block, and operation S250 of increasing a voltage of the bit lines connected to the selected memory block to an erase voltage by increasing a voltage of a conductive layer located over the selected memory block.

In operation S210, a first voltage is applied to a fast bit line among a plurality of bit lines. The fast bit line may be a bit line connected to a memory string determined that erase verification of the bit line has passed in the erase verify step of a previous erase loop. In operation S220, a second voltage higher than the first voltage is applied to slow bit lines as the other bit lines except the fast bit line among the plurality of bit lines. The slow bit lines may be bit lines connected to a memory string determined that erase verification of the bit lines has failed in the erase verify operation of the previous erase loop.

In FIG. 10, it is illustrated that operation S220 is performed after operation S210 is performed, but the present disclosure is not limited thereto. Operation S210 may be performed after operation S220 is performed, and operations S210 and S220 may be simultaneously performed. When the operations S210 and S220 are performed, the fast bit line and the slow bit line are initialized to different voltage values. As described above, the second voltage may have a value greater than that of the first voltage. That is, the fast bit line is initialized to a relatively low voltage, and the slow bit line is initialized to a relatively high voltage.

In operation S230, the bit lines connected to the selected memory block are floated. In an embodiment, both the fast bit line and the slow bit line may be floated. In another embodiment, the fast bit line is not floated, but only the slow bit line may be floated.

Subsequently, in operation S250, the voltage of the upper conductive layer L1 shown in FIGS. 4 and 5 is increased. Accordingly, the voltage of the bit lines is increased to the erase voltage by capacitive coupling between the upper conductive layer L1 and the bit lines. When both the fast bit line and the slow bit line are floated in operation S230, in operation S250, both the voltages of the fast bit line and the slow bit line are increased by the capacitive coupling. When only the slow bit line is floated in operation S230, in operation S250, the voltage of the slow bit line is increased by the capacitive coupling.

Figure 11:
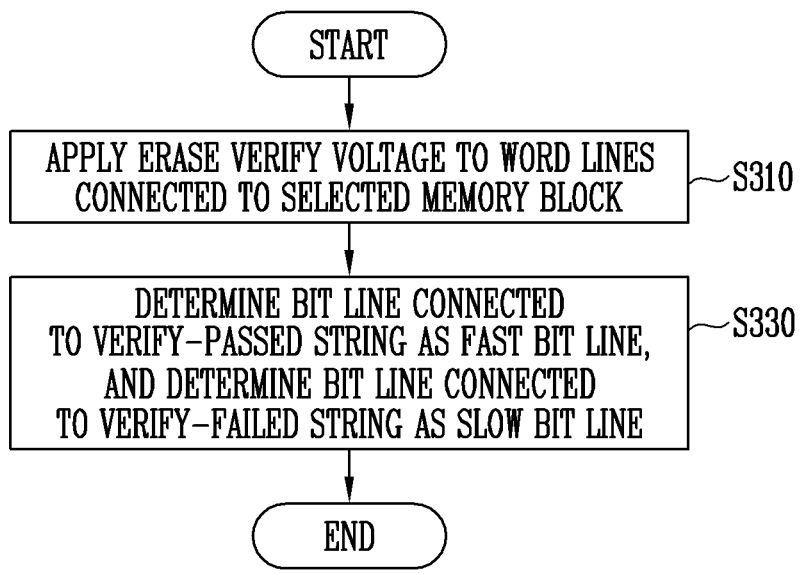
FIG. 11 is a flowchart illustrating an embodiment of the present disclosure for an operation of distinguishing a fast bit line and a slow bit line.

FIG. 11 is a flowchart illustrating an operation of distinguishing the fast bit line and the slow bit line in accordance with an embodiment of the present disclosure. More specifically, FIG. 11 is a flowchart illustrating an embodiment of the operation of performing the erase verify operation among the plurality of erase loops.

Referring to FIG. 11, in order to distinguish the fast bit line and the slow bit line from each other, an erase verify voltage is first applied to word lines connected to the selected memory block (S310). Accordingly, each of the page buffer groups may determine an erase verify result of corresponding memory strings, and store the erase verify result in a latch. As described above, when threshold voltages of memory cells included in a memory string are all lower than the erase verify voltage, a current may flow through a bit line connected to the corresponding memory string. When threshold voltages of some memory cells among memory cells included in a memory string are higher than the erase verify voltage, no current flows through a bit line connected to the corresponding memory string. In this manner, it may be verified whether memory cells have been completely erased for each memory string.

In operation S330, a bit line connected to a verify-passed string is determined as a fast bit line, according to the verify result of operation S310. Memory cells included in the memory string connected to the fast bit line are erase-passed memory cells and may be memory cells which are unnecessary to additionally erase. In operation S330, a bit line connected to a verify-failed string is determined as a slow bit line. Memory cells included in the memory string connected to the slow bit line are erase-failed memory cells and may be memory cells which are necessary to additionally erase.

Figure 12:
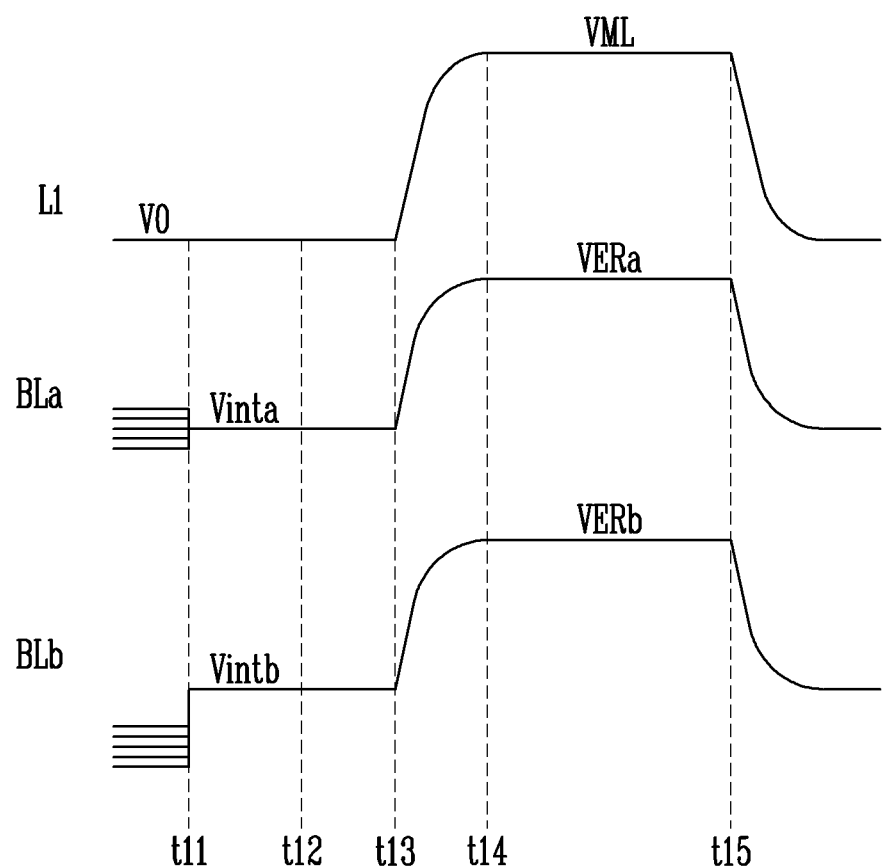
FIG. 12 is a timing diagram illustrating the operating method of the memory device in accordance with an embodiment of the present disclosure.

FIG. 12 is a timing diagram illustrating the operating method of the memory device in accordance with another embodiment of the present disclosure.

Referring to FIG. 12, the voltage of the upper conductive layer L1, the voltage of fast bit lines BLa among the bit lines, and the voltage of slow bit lines BLb among the bit lines according to time are illustrated. In FIG. 12, illustration of voltages of the word lines, the common source line, the source select line, and the drain select line are omitted.

Before a time t11, the voltage of the upper conductive layer L1 may be a voltage V0. In an embodiment, the voltage V0 may be a ground voltage. Before the time t11, the voltages of the fast bit lines BLa and the slow bit lines BLb may have different values.

According to operation S210 shown in FIG. 10, a first voltage Vinta may be applied to the fast bit lines BLa at the time t11. According to operation S220 shown in FIG. 10, a second voltage Vintb may be applied to the slow bit lines BLb at the time t11. As described above, the second voltage Vintb is higher than the first voltage Vinta.

Subsequently, at a time t12, the fast bit lines BLa and the slow bit lines BLb are floated (S230). However, the present disclosure is not limited thereto as described above. At the time t12, the fast bit lines BLa are not floated, but only the slow bit lines BLb may be floated.

Subsequently, at a time t13, the voltage of the upper conductive layer L1 is increased (S250). The voltage of the upper conductive layer L1 may reach a high voltage VML at a time t14. Accordingly, the voltages of the fast bit lines BLa and the slow bit lines BLb may be increased by capacitive coupling between the upper conductive layer L1 and the bit lines. More specifically, the voltage of the fast bit lines BLa may be increased from the first voltage Vinta to an erase voltage VERa. The voltage of the slow bit lines BLb may be increased from the second voltage Vintb to an erase voltage VERb. Accordingly, during a period between the time t14 and a time t15, a GIDL current is generated between the drain select line DSL and the junction region of the drain select transistor DST, and therefore, an erase operation of memory cells is performed.

When the voltage increments caused by the capacitive coupling are similar to each other, the second voltage Vintb is higher than the first voltage Vinta and hence the erase voltage VERb may be higher than the erase voltage VERa. Therefore, a threshold voltage shift width of memory cells of memory strings connected to the fast bit line BLa is smaller than that of memory cells of memory strings connected to the slow bit line BLb. Thus, a threshold voltage distribution width of memory cells according to the erase operation can be narrowly formed. Consequently, the threshold voltage distribution of memory cells after the erase operation can be further improved.

Subsequently, at the time t15, the voltage of the upper conductive layer L1 is increased. Accordingly, the voltages of the fast bit lines BLa and the slow bit lines BLb are also decreased.

Figure 13:
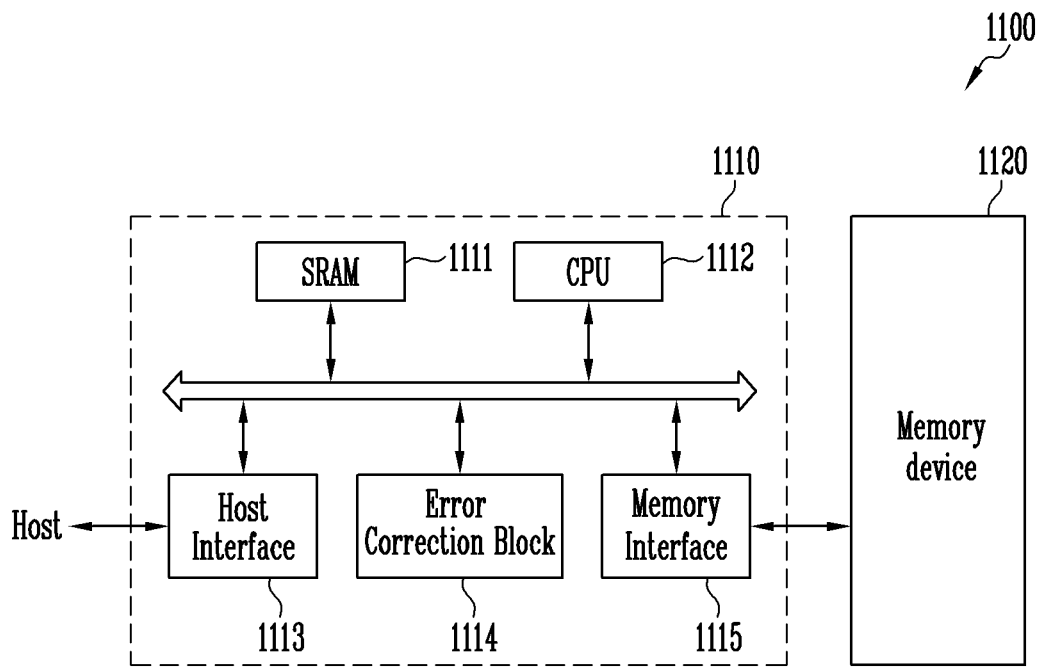
FIG. 13 is a block diagram illustrating a configuration of a memory system in accordance with an embodiment of the present disclosure.

FIG. 13 is a block diagram illustrating a configuration of a memory system in accordance with an embodiment of the present disclosure.

Referring to FIG. 13, the memory system 1100 includes a memory device 1120 and a memory controller 1110.

The memory device 1120 may be a multi-chip package configured with a plurality of flash memory chips. In an embodiment, the memory device 1120 may include a memory cell array, bit lines connected to the memory cell array, and a conductive layer located over the bit lines.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include a Read Only Memory (ROM) for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 14:
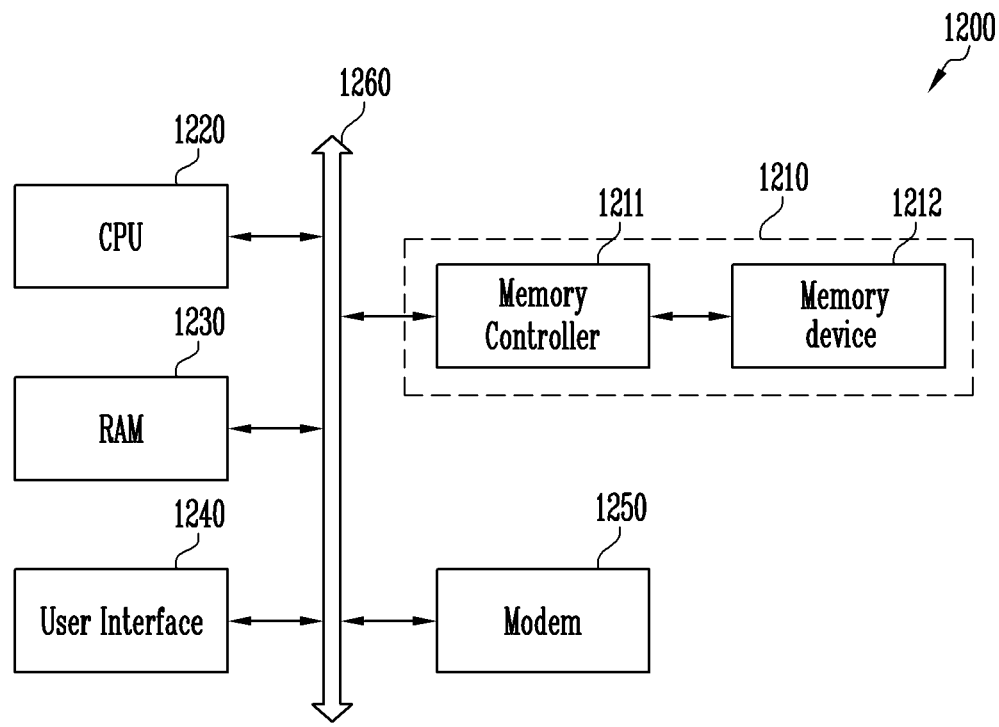
FIG. 14 is a block diagram illustrating a configuration of a computing system in accordance with an embodiment of the present disclosure.

FIG. 14 is a block diagram illustrating a configuration of a computing system in accordance with an embodiment of the present disclosure.

Referring to FIG. 14, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211.

In accordance with the present disclosure, there can be provided a memory device having improved erase performance and an operating method thereof.

The embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

From the foregoing it will be appreciated that, although specific embodiments of the invention have been described herein for purposes of illustration, various modifications may be made without deviating from the spirit and scope of the invention. Accordingly, the invention should not be limited except according to the following appended claims.

What is claimed is:

1. A memory device comprising:
a common source line formed over a substrate;
a memory cell array formed over the common source line;
bit lines connected to the memory cell array;
a conductive layer formed over the bit lines; and
a logic circuit connected to the conductive layer and the bit lines,
wherein the logic circuit is configured to apply an initialization voltage to the bit lines, float the bit lines and increase a voltage of the bit lines to an erase voltage through capacitive coupling between the conductive layer and the bit lines by increasing a voltage applied to the conductive layer in an erase operation.

2. The memory device of claim 1,
wherein the memory cell array includes:
a gate stack structure including interlayer insulating layers and conductive patterns, which are alternately stacked; and
channel structures connected to the common source line while penetrating the gate stack structure, and
wherein each of the channel structures is connected to a bit line corresponding thereto among the bit lines.

3. The memory device of claim 2, wherein the common source line includes a contact region not overlapping with the gate stack structure.

4. The memory device of claim 3, further comprising a conductive source contact structure extending toward the conductive layer from the contact region of the common source line.

5. The memory device of claim 4, wherein the logic circuit includes:
a peripheral circuit including a source line driver configured to provide an erase voltage to the common source line or discharge the common source line; and
an internal voltage generator configured to provide internal voltages to the peripheral circuit.

6. The memory device of claim 5, wherein the conductive layer connects the common source line to the source line driver.

7. The memory device of claim 5, wherein the conductive layer connects the internal voltage generator to the peripheral circuit.

8. The memory device of claim 1,
wherein the logic circuit increases the voltage of the bit lines from the initialization voltage to the erase voltage by increasing the voltage of the conductive layer.

9. The memory device of claim 1, wherein the logic circuit increases the voltage of the bit lines by:
applying a first voltage to a first bit line connected to a memory string of which an erase verify operation has passed among the bit lines;
applying a second voltage higher than the first voltage to a second bit line connected to a memory string of which the erase verify operation has failed among the bit lines;
floating the first bit line and the second bit line; and
increasing a voltage of the first bit line from the first voltage to a first erase voltage and increasing a voltage of the second bit line from the second voltage to a second erase voltage higher than the first erase voltage, by increasing the voltage of the conductive layer.

10. The memory device of claim 1, wherein the logic circuit increases the voltage of the bit lines by:
applying a first voltage to a first bit line connected to a memory string of which an erase verify operation has passed among the bit lines;
applying a second voltage higher than the first voltage to a second bit line connected to a memory string of which the erase verify operation has failed among the bit lines;
floating the second bit line; and
increasing a voltage of the second bit line from the second voltage to the erase voltage by increasing the voltage of the conductive layer.

11. A method for operating a memory device including a plurality of bit lines and a conductive layer formed over the plurality of bit lines, the method comprising:
applying an initialization voltage to the bit lines;
floating the bit lines; and
increasing a voltage of the bit lines from the initialization voltage to an erase voltage through capacitive coupling between the conductive layer and the bit lines by increasing a voltage of the conductive layer.

12. The method of claim 11, wherein the initialization voltage is a ground voltage.

13. The method of claim 11, wherein the initialization voltage is a voltage higher than 0V.

14. The method of claim 11, wherein, when the voltage of the bit lines is increased to the erase voltage, a gate induced drain leakage (GIDL) current is generated between a junction region of a select transistor connected to the bit line and a drain select line.

15. The method of claim 11, wherein the applying the initialization voltage to the bit lines includes:
applying a first voltage to a first bit line connected to a memory string of which an erase verify operation has passed among the bit lines; and
applying a second voltage higher than the first voltage to a second bit line connected to a memory string of which the erase verify operation has failed among the bit lines.

16. The method of claim 15, wherein the floating of the bit lines includes floating the first bit line and the second bit line.

17. The method of claim 16, wherein the increasing the voltage of the bit lines from the initialization voltage to the erase voltage through the capacitive coupling includes increasing a voltage of the first bit line from the first voltage to a first erase voltage and increasing a voltage of the second bit line from the second voltage to a second erase voltage higher than the first erase voltage, by increasing the voltage of the conductive layer.

18. The method of claim 15, wherein the floating of the bit lines includes floating the second bit line.

19. The method of claim 18, wherein the increasing the voltage of the bit lines from the initialization voltage to the erase voltage through the capacitive coupling includes increasing a voltage of the second bit line from the second voltage to the erase voltage by increasing the voltage of the conductive layer.

20. A memory device comprising:
a common source line formed on a substrate;
a memory cell array formed on the common source line and including first and second memory cell strings;
first and second bit lines electrically coupled respectively to the first and second memory cell strings;
a conductive layer disposed over the bit lines; and
a logic circuit electrically coupled to the conductive layer and the bit lines and configured to:
apply first and second initialization voltages respectively to the first and second bit lines, float the second bit line, and
raise a voltage of the conductive layer to raise, through capacitive coupling between the conductive layer and the second bit line, a voltage of the second bit line to a second erase voltage.

* * * * *